US010209016B2

(12) United States Patent
Dede et al.

(10) Patent No.: US 10,209,016 B2
(45) Date of Patent: Feb. 19, 2019

(54) THERMAL ENERGY GUIDING SYSTEMS INCLUDING ANISOTROPIC THERMAL GUIDING COATINGS AND METHODS FOR FABRICATING THE SAME

(71) Applicant: Toyota Motor Engineering & Manufacturing North America, Inc., Erlanger, KY (US)

(72) Inventors: Ercan Mehmet Dede, Ann Arbor, MI (US); Tsuyoshi Nomura, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 366 days.

(21) Appl. No.: 13/848,827

(22) Filed: Mar. 22, 2013

(65) Prior Publication Data
US 2014/0284039 A1 Sep. 25, 2014

(51) Int. Cl.
*H05K 7/20* (2006.01)
*F28F 13/14* (2006.01)
(Continued)

(52) U.S. Cl.
CPC ............ *F28F 13/14* (2013.01); *F28F 21/067* (2013.01); *F28F 21/089* (2013.01);
(Continued)

(58) Field of Classification Search
CPC ........ B05D 5/00; B05D 7/532; B05D 7/5323; B05D 7/5385; F28F 21/089;
(Continued)

(56) References Cited

U.S. PATENT DOCUMENTS 2,711,382 A * 6/1955 Smith-Johannsen ....................... B21D 53/04
165/185
4,999,741 A * 3/1991 Tyler ...................... H05K 3/284
165/185
(Continued)

FOREIGN PATENT DOCUMENTS

CN 101083895 A 12/2007

OTHER PUBLICATIONS

Narayana, et al.; Heat Flux Manipulation with Engineered Thermal Materials; Physical Review Letters; May 25, 2012; pp. 214303-1-214303-5; American Physical Society.
(Continued)

*Primary Examiner* — Leonard R Leo
(74) *Attorney, Agent, or Firm* — Dinsmore & Shohl LLP (57) ABSTRACT

Thermal energy guiding systems and methods for fabricating thermal energy guiding systems are provided. A thermal energy guiding system includes a thermal energy source and an anisotropic thermal guiding coating in thermal communication with a surface of the thermal energy source. The anisotropic thermal guiding coating includes a plurality of layers including a first layer and a second layer. The first layer has a first thermal conductivity and the second layer has a second thermal conductivity. The plurality of layers are non-uniformly arranged on the surface of the thermal energy source in order to guide thermal energy from the thermal energy source according to a thermal energy management objective.

16 Claims, 9 Drawing Sheets

(51) Int. Cl.
*H01L 23/373* (2006.01)
*F28F 21/06* (2006.01)
*F28F 21/08* (2006.01)

(52) U.S. Cl.
CPC ....... *F28F 2245/00* (2013.01); *F28F 2245/06* (2013.01); *H01L 23/3733* (2013.01); *H01L 23/3735* (2013.01); *H01L 23/3737* (2013.01); *H05K 7/2039* (2013.01); *H05K 7/20518* (2013.01)

(58) Field of Classification Search
CPC .. F28F 2245/00; F28F 2245/06; F28F 21/067; H05K 7/2039; H05K 7/20518; H01L 23/3733; H01L 23/3735; H01L 23/3737
USPC .................. 165/133, 185; 427/265; 361/704
See application file for complete search history.

(56) References Cited

U.S. PATENT DOCUMENTS

| | | | | |
|---|---|---|---|---|
| 5,315,480 | A * | 5/1994 | Samarov | H05K 3/284 174/252 |
| 5,518,758 | A * | 5/1996 | Tiburtius et al. | 427/8 |
| 7,268,293 | B2 * | 9/2007 | Smith | H02K 3/30 174/110 R |
| 7,480,145 | B2 | 1/2009 | Ali | |
| 7,688,586 | B2 * | 3/2010 | Tomioka | H01L 23/3735 165/185 |
| 7,799,428 | B2 * | 9/2010 | Fujiwara | H01L 23/373 165/185 |
| 7,889,502 | B1 * | 2/2011 | Reis | H05K 7/205 174/16.3 |
| 8,021,743 | B2 | 9/2011 | Lin et al. | |
| 8,075,729 | B2 | 12/2011 | Holland et al. | |
| 8,081,468 | B2 | 12/2011 | Hill et al. | |
| 8,124,458 | B2 * | 2/2012 | Su | H01L 21/6836 257/774 |
| 8,516,831 | B2 | 8/2013 | Dede | |
| 8,896,117 | B2 * | 11/2014 | Ko et al. | 257/734 |
| 2003/0099836 | A1 * | 5/2003 | Gandi | H01L 23/373 428/408 |
| 2006/0120011 | A1 * | 6/2006 | Handa et al. | 361/234 |
| 2008/0271875 | A1 * | 11/2008 | Lima | H01L 23/3735 361/704 |
| 2009/0017260 | A1 | 1/2009 | Kulkarni et al. | |
| 2010/0255303 | A1 * | 10/2010 | Wardle | B82Y 10/00 428/378 |
| 2011/0232888 | A1 | 9/2011 | Sasaki | |
| 2012/0000639 | A1 | 1/2012 | Dede | |
| 2012/0234524 | A1 * | 9/2012 | Fan | H01L 23/373 165/185 |

OTHER PUBLICATIONS

Zain-Ul-Abdein, et al.; Computational Investigation of Factors Affecting Thermal Conductivity in a Particulate Filled Composite Using Finite Element Method; Apr. 20, 2012; pp. 86-98; International Journal of Engineering Science 56 (2012).

Dede; Simulation and Optimization of Heat Flow via Anisotropic Material Thermal Conductivity; Oct. 12, 2010; pp. 510-515; Computational Materials Science 50 (2010).

First Office Action dated Feb. 27, 2017 for CN Application No. 201410106383.0 filed Mar. 21, 2014.

* cited by examiner

FIG. 9 ical field

The present specification generally relates to thermal energy guiding systems and, more specifically, to thermal energy guiding systems including anisotropic thermal guiding coatings and methods for fabricating thermal energy guiding systems including anisotropic thermal guiding coatings.

BACKGROUND

A number of devices emit thermal energy in various quantities and forms. For example, electronic components, internal combustion engines, motors, electromechanical systems, and the like may emit thermal energy that is dissipated to the environment. It may be desirable to manage such emitted thermal energy, such as by controlling the dissipation to the environment and/or guiding the emitted thermal energy to a desired location for potential harvesting of the thermal energy.

Accordingly, a need exists for thermal energy guiding systems including anisotropic thermal guiding coatings and methods for fabricating thermal energy guiding systems including anisotropic thermal guiding coatings.

SUMMARY

In one embodiment, a thermal energy guiding system includes a thermal energy source and an anisotropic thermal guiding coating in thermal communication with a surface of the thermal energy source. The anisotropic thermal guiding coating includes a plurality of layers including a first layer and a second layer. The first layer has a first thermal conductivity and the second layer has a second thermal conductivity. The plurality of layers are non-uniformly arranged on the surface of the thermal energy source in order to guide thermal energy from the thermal energy source according to a thermal energy management objective.

In another embodiment, a method for fabricating a thermal energy guiding system includes providing a thermal energy source and coating a surface of the thermal energy source with an anisotropic thermal guiding coating in a non-uniform manner, such that the anisotropic thermal energy guiding coating is in thermal communication with the surface of the thermal energy source. The anisotropic thermal guiding coating includes a plurality of layers including a first layer and a second layer. The first layer has a first thermal conductivity and the second layer has a second thermal conductivity. The plurality of layers are non-uniformly arranged on the surface of the thermal energy source in order to guide thermal energy from the thermal energy source according to a thermal energy management objective.

In yet another embodiment, a thermal energy guiding system includes a thermal energy source and an anisotropic thermal guiding coating in thermal communication with a surface of the thermal energy source. The anisotropic thermal guiding coating is a conformal coating that conforms to a shape of the thermal energy source. The anisotropic thermal guiding coating includes a plurality of layers including a first layer and a second layer. The first layer has a first thermal conductivity and the second layer has a second thermal conductivity. The first layer is formed from silicone including a plurality of thermally conductive particles. The second layer is formed from silicone and does not include the thermally conducive particles.

These and additional features provided by the embodiments of the present disclosure will be more fully understood in view of the following detailed description, in conjunction with the drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

The embodiments disclosed herein include thermal energy guiding systems including anisotropic thermal guiding coatings and methods for fabricating thermal energy guiding systems including anisotropic thermal guiding coatings. Referring generally to the figures, thermal energy guiding systems, as described herein, may include a thermal energy source and an anisotropic thermal guiding coating in thermal communication with a surface of the thermal energy source. The anisotropic thermal guiding coatings described herein include a plurality of layers having differing thermal conductivities that, when the plurality of layers are non-uniformly arranged on the surface of the thermal energy source, guide thermal energy from the thermal energy source according to a thermal energy management objective, such as to maximize uniform heat flow from the thermal energy source to an ambient environment, to minimize uniform heat flow from the thermal energy source to an ambient environment, to optimize non-uniform heat flow to one or more locations, to guide heat to a thermal energy capture device, or the like. Such guided thermal energy may be captured or harvested for further use. The various thermal energy guiding systems including anisotropic thermal guiding coatings and methods for fabricating thermal energy guiding systems including anisotropic thermal guiding coatings will be described in more detail herein with specific reference to the corresponding drawings.

Figure 1:
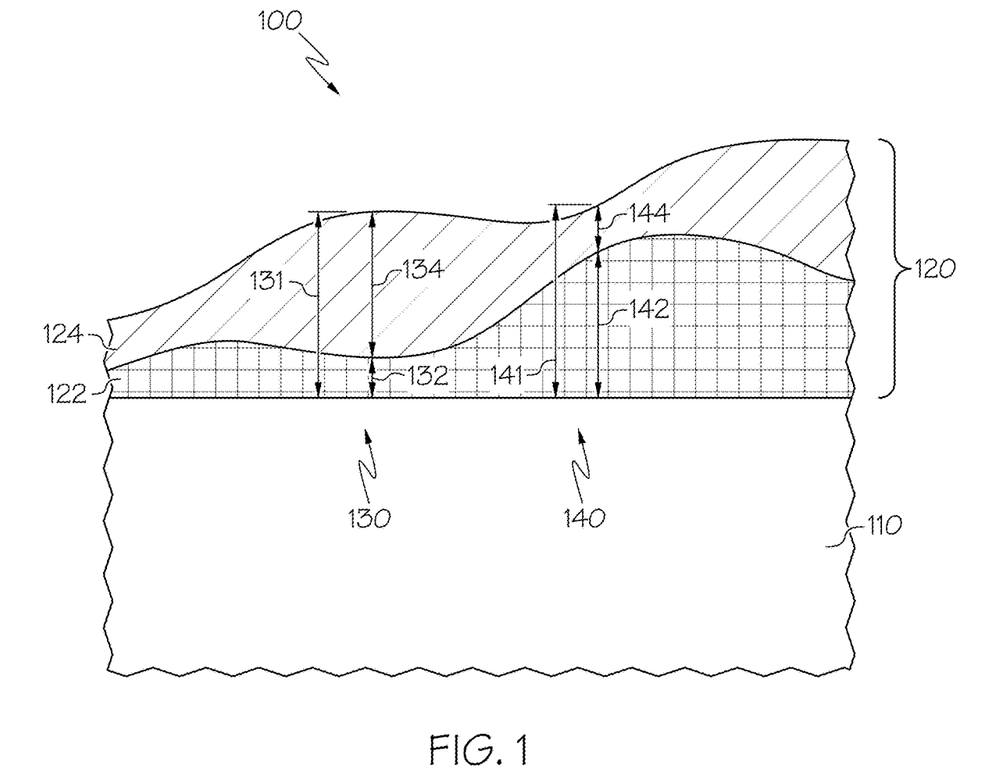
FIG. 1 schematically depicts a thermal energy guiding system including a thermal energy source and an anisotropic thermal guiding coating, according to one or more embodiments shown and described herein.

Referring now to FIG. 1, a thermal energy guiding system 100 is schematically depicted. The thermal energy guiding system 100 includes a thermal energy source 110 and an anisotropic thermal guiding coating 120 in thermal communication with a surface of the thermal energy source 110. The thermal energy source 110 may be any device that emits thermal energy. For example, in some embodiments, the thermal energy source 110 may be an electronic module or an electronic component, such as an integrated circuit. In some embodiments, the thermal energy source 110 may be a battery that emits thermal energy as a byproduct of converting chemical energy into electrical energy. In some embodiments, the thermal energy source 110 may be a motor or internal combustion engine that emits thermal energy. In some embodiments, the thermal energy source 110 may be a thermal energy emitting electromechanical system. The thermal energy source 110 may be any shape. In some embodiments, the thermal energy source 110 may be rectangularly or circularly shaped. In some embodiments, the thermal energy source 110 may be oddly shaped. Furthermore, in some embodiments, the thermal energy source 110 may include one component that emits thermal energy while, in other embodiments, the thermal energy source 110 may include a plurality of components that emit thermal energy.

Still referring to FIG. 1, the anisotropic thermal guiding coating 120 is in thermal communication with a surface of the thermal energy source 110. In some embodiments, the anisotropic thermal guiding coating 120 is a conformal coating that conforms to the shape of the thermal energy source 110. In some embodiments, the anisotropic thermal guiding coating 120 does not conform to the shape of the thermal energy source 110, such as in embodiments in which the anisotropic thermal guiding coating 120 is rigid and does not match the shape of the thermal energy source 110.

The anisotropic thermal guiding coating 120 includes a plurality of layers. The plurality of layers include a first layer 122 and a second layer 124. While the anisotropic thermal guiding coating 120 depicted in FIG. 1 includes, two layers, it should be understood that in some embodiments the anisotropic thermal guiding coating 120 includes more than two layers. In some embodiments that include more than two layers, one or more of the additional layers may be formed from the same material as the first layer 122. Similarly, in some embodiments that include more than two layers, one or more of the additional layers may be formed from the same material as the second layer 124. For example, in some embodiments, the anisotropic thermal guiding coating 120 may include a plurality of layers stacked on the surface of the thermal energy source 110 that alternate between the material of the first layer 122 and the second layer 124. In some embodiments, the anisotropic thermal guiding coating 120 may include a plurality of layers stacked on the surface of the thermal energy source 110 that alternate among three or more layer compositions. In the embodiment depicted in FIG. 1, the first layer 122 is disposed between the second layer 124 and the thermal energy source 110. However, in other embodiments, the second layer 124 is disposed between the first layer 122 and the thermal energy source 110.

Still referring to FIG. 1, the first layer 122 has a first thermal conductivity $K_1$ and the second layer 124 has a second thermal conductivity $K_2$. The first thermal conductivity $K_1$ is different from the second thermal conductivity $K_2$. In some embodiments, the first thermal conductivity $K_1$ is greater than the second thermal conductivity $K_2$. In other embodiments, the first thermal conductivity $K_1$ is less than the second thermal conductivity $K_2$. The thermal conductivities of the first layer and the second layer may differ due to the differing physical composition of the first layer 122 and the second layer 124. For example, in some embodiments, the first layer 122 may include a plurality of thermally conductive particles while the second layer 124 may not include the thermally conductive particles, such that the first thermal conductivity $K_1$ of the first layer 122 is greater than the second thermal conductivity $K_2$ of the second layer 124. The thermally conductive particles may include a metal particle (e.g., copper, aluminum, silver, gold, etc.), a graphite particle, a fiber composite particle, a ceramic particle, or combinations thereof.

Still referring to FIG. 1 in the context of the composition of the first layer 122 and the second layer 124, in some embodiments, the first layer 122 is formed from a first insulating material including a plurality of thermally conductive particles and the second layer is formed from a second insulating material that does not include thermally conductive particles, such that the first thermal conductivity $K_1$ of the first layer 122 is greater than the second thermal conductivity $K_2$ of the second layer 124. In some such embodiments, the first insulating material is the same as the second insulating material, while in other such embodiments, the first insulating material is different from the second insulating material. The first insulating material and/or the second insulating material may include silicone. In some embodiments, the first insulating material and/or the second insulating material may be an insulating material other than silicone, such as nylon or epoxy. In one non-limiting example, the first insulating material is silicone that includes thermally conductive particles and the second insulating material is silicone that does not include thermally conductive particles, such as when the first layer 122 is formed from silicone including a plurality of copper particles and the second layer 124 is formed from silicone that is substantially free from thermally conductive particles.

Still referring to FIG. 1 in the context of the composition of the first layer 122 and the second layer 124, in some embodiments, the first layer 122 is formed from a first insulating material including a first plurality of thermally conductive particles and the second layer is formed from a second insulating material including a second plurality of thermally conductive particles, such that the first thermal conductivity $K_1$ of the first layer 122 is greater than the second thermal conductivity $K_2$ of the second layer 124. The thermally conductive particles of the first plurality of thermally conductive particles are different from the thermally conductive particles of the second plurality of thermally conductive particles. In some embodiments, the first insulating material is the same as the second insulating material, while in other embodiments, the first insulating material is different from the second insulating material.

Still referring to FIG. 1 in the context of the composition of the first layer 122 and the second layer 124, in some embodiments, the first layer 122 is formed from a first insulating material including a first plurality of thermally conductive particles having a first concentration and the second layer is formed from a second insulating material including a second plurality of thermally conductive particles having a second concentration. The first concentration of the first plurality of thermally conductive particles in the first layer 122 exceeds the second concentration of the second plurality of thermally conductive particles in the second layer 124, such that the first thermal conductivity $K_1$ of the first layer 122 is greater than the second thermal conductivity $K_2$ of the second layer 124. In some such embodiments, the first insulating material is the same as the second insulating material, while in other such embodiments, the first insulating material is different from the second insulating material. As stated above, the first insulating material and/or the second insulating material may include silicone. In some embodiments, the first insulating material and/or the second insulating material may be an insulating material other than silicone, such as nylon or epoxy. In some embodiments, the thermally conductive particles of the first plurality of thermally conductive particles are the same thermally conductive particles of the second plurality of thermally conductive particles, while in other embodiments, the thermally conductive particles of the first plurality of thermally conductive particles are different from the thermally conductive particles of the second plurality of thermally conductive particles.

Still referring to FIG. 1, the plurality of layers (which include the first layer 122 and the second layer 124) are non-uniformly arranged on the surface of the thermal energy source 110 in order to guide thermal energy from the thermal energy source 110 according to a thermal energy management objective. In some embodiments, the plurality of layers are non-uniformly arranged on the surface of the thermal energy source 110 such that the thicknesses of the plurality of layers varies along the surface of the thermal energy source 110. For example, as depicted in FIG. 1, a first thickness 131 of the anisotropic thermal guiding coating 120 at a first location 130 includes a first thickness 132 of the first layer 122 and a first thickness 134 of the second layer 124. A second thickness 141 of the anisotropic thermal guiding coating 120 at a second location 140 includes a second thickness 142 of the first layer 122 and a second thickness 144 of the second layer 124. As shown in FIG. 1, the first thickness 132 of the first layer 122 is less than the second thickness 142 of the first layer 122. While FIG. 1 depicts the plurality of layers having non-uniform thicknesses along the surface of the thermal energy source 110, in some embodiments, the plurality of layers may be non-uniformly arranged in a different or additional way, such as when the plurality of layers are non-uniformly arranged on the surface of the thermal energy source 110 such that the orientations and/or directions of the various layers are non-uniform relative to one another, as will be described in further detail below with reference to FIGS. 3A-3B.

Still referring to FIG. 1, the plurality of layers of the anisotropic thermal guiding coating 120 are non-uniformly arranged on the surface of the thermal energy source 110 in order to guide thermal energy from the thermal energy source 110 according to a thermal energy management objective. In some embodiments, the thermal energy management objective may be to maximize uniform heat flow from the thermal energy source 110 to an ambient environment (e.g., as will be described in further detail below with reference to FIGS. 5A-5B). In some embodiments, the thermal energy management objective may be to minimize uniform heat flow from the thermal energy source 110 to an ambient environment (e.g., as will be described in further detail below with reference to FIGS. 6A-6B). In some embodiments, the thermal energy management objective may be to optimize non-uniform heat flow to one or more locations (e.g., as will be described in further detail below with reference to FIGS. 7A-7B). In some embodiments, the thermal energy management objective may be to guide heat to a thermal energy capture device, such as a heat sink, that is in thermal communication with the anisotropic thermal guiding coating 120. It should be understood that the anisotropic thermal guiding coating 120 may guide thermal energy from the thermal energy source 110 according to many thermal energy management objectives other than those specifically described herein.

Figure 2A:
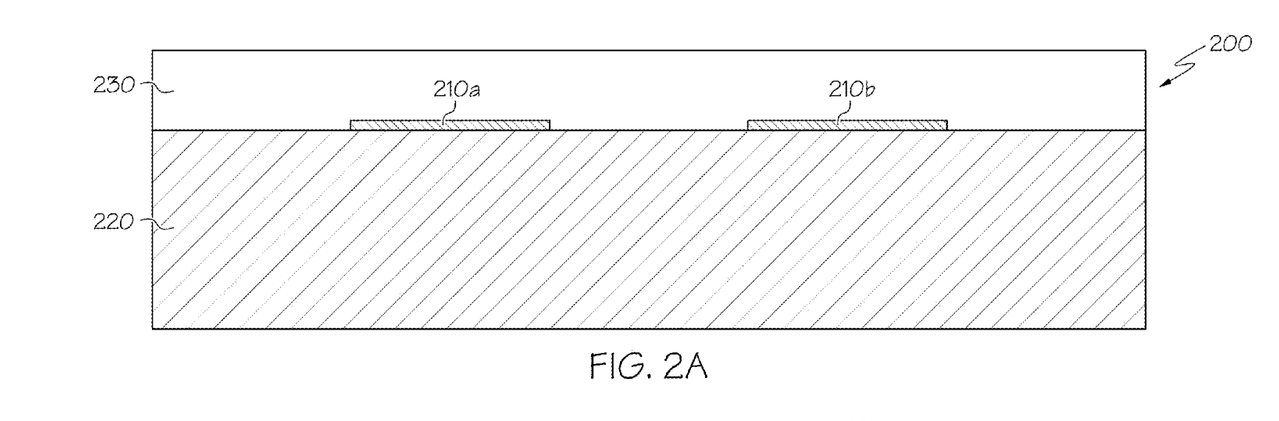
FIG. 2A schematically depicts a thermal energy guiding system including electronic devices, a thermal energy capture device, and a uniform thermal guiding coating, according to one or more embodiments shown and described herein.

Referring now to FIG. 2A, a thermal energy guiding system 200 is schematically depicted. The thermal energy guiding system 200 includes electronic devices 210a, 210b, a thermal energy capture device 220, and a uniform thermal guiding coating 230. The thermal energy capture device 220 is in thermal communication with the electronic devices 210a, 210b. The uniform thermal guiding coating 230 is in thermal communication with the electronic devices 210a, 210b and is in thermal communication with the thermal energy capture device 220.

Still referring to FIG. 2A, the electronic devices 210a, 210b may generate thermal energy in operation, such as microprocessors, integrated circuits, or other electronic components. In some embodiments, the electronic devices 210a, 210b may generate the same amount of thermal energy during operation, while in other embodiments the electronic devices 210a, 210b may generate a different amount of thermal energy during operation. While FIG. 2A depicts two electronic devices 210a, 210b, some embodiments may include only one electronic device or more than two electronic devices.

Still referring to FIG. 2A, the thermal energy capture device 220 may be any device to which thermal energy from the electronic devices 210a, 210b may be directed. In some embodiments, the thermal energy capture device 220 may be a heat sink, such as an aluminum heat spreader. In some embodiments, the thermal energy capture device 220 may be a heat sink other than an aluminum heat spreader.

As noted above, the uniform thermal guiding coating 230 is in thermal communication with the electronic devices 210a, 210b and is in thermal communication with the thermal energy capture device 220. The uniform thermal guiding coating 230 may function to direct at least a portion of the thermal energy emitted by the electronic devices 210a, 210b to the thermal energy capture device 220. In some embodiments, the uniform thermal guiding coating 230 is a uniform layer of silicone having the same thickness across the width of the thermal energy guiding system 200. In other embodiments, the uniform thermal guiding coating 230 may be formed from a material other than silicone.

Figure 2B:
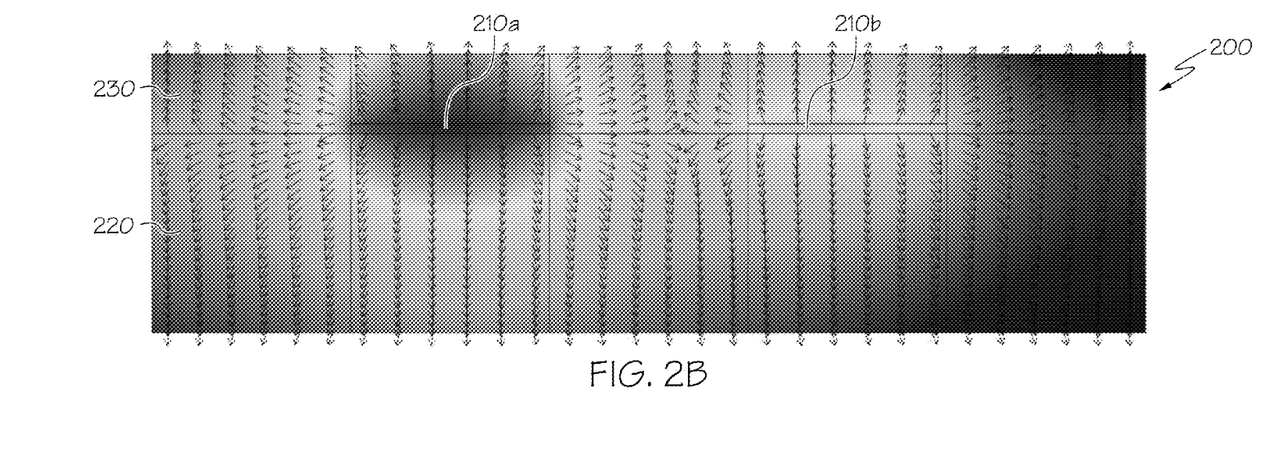
FIG. 2B schematically depicts a temperature contour plot of the thermal energy guiding system of FIG. 2A, according to one or more embodiments shown and described herein.

Referring now to FIG. 2B, a temperature contour plot of the thermal energy guiding system 200 of FIG. 2A is schematically depicted. The temperature at each point within the thermal energy guiding system 200 is represented by a color, in which dark blue is the lowest temperature depicted and dark red is the highest temperature depicted. The color of the thermal energy guiding system 200 varies from dark blue to dark red at various locations within the thermal energy guiding system 200 in order to represent the temperature at each location in the manner that is known for temperature contour plots. Furthermore, FIG. 2B depicts normalized heat flux vectors at various locations within the thermal energy guiding system 200. Each of the heat flux vectors depicts the directional thermal energy transfer at the location from which the vector originates.

In the embodiment depicted in FIG. 2B, electronic device 210a generates a first amount of heat and electronic device 210b generates a second amount of heat that is two thirds the first amount of heat. The maximum temperature of the electronic device 210a is 425.8 K. As shown by the heat flux vectors depicted in FIG. 2B, the thermal energy is dissipated from the electronic devices 210a, 210b in a directionally uniform manner.

Figure 3A:
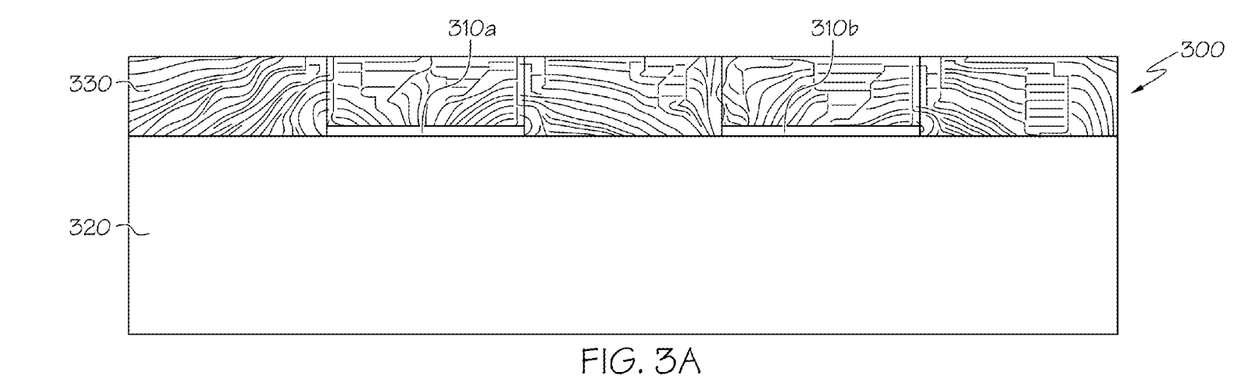
FIG. 3A schematically depicts a thermal energy guiding system including electronic devices, a thermal energy capture device, and a non-uniform anisotropic thermal guiding coating, according to one or more embodiments shown and described herein.

Referring now to FIG. 3A, a thermal energy guiding system 300 including electronic devices 310a, 310b, a thermal energy capture device 320, and non-uniform anisotropic thermal guiding coating 330 is schematically depicted. The thermal energy capture device 320 is in thermal communication with the electronic devices 310a, 310b. The non-uniform anisotropic thermal guiding coating 330 is in thermal communication with the electronic devices 310a, 310b and is in thermal communication with the thermal energy capture device 320.

Still referring to FIG. 3A, the electronic devices 310a, 310b may generate thermal energy in operation, such as microprocessors, integrated circuits, or other electronic components. In some embodiments, the electronic devices 310a, 310b may generate the same amount of thermal energy during operation, while in other embodiments the electronic devices 310a, 310b may generate a different amount of thermal energy during operation. While FIG. 3A depicts two electronic devices 310a, 310b, some embodiments may include only one electronic device or more than two electronic devices. For comparative purposes, the electronic devices 310a, 310b of FIG. 3A are the same as the electronic devices 210a, 210b of FIG. 2A. However, in other embodiments, the electronic devices 310a, 310b of FIG. 3A may be different from the electronic devices 210a, 210b of FIG. 2A.

Still referring to FIG. 3A, the thermal energy capture device 320 may be any device to which thermal energy from the electronic devices 310a, 310b may be directed. In some embodiments, the thermal energy capture device 320 may be a heat sink, such as an aluminum heat spreader. In some embodiments, the thermal energy capture device 320 may be a heat sink other than an aluminum heat spreader. For comparative purposes, the thermal energy capture device 320 of FIG. 3A is the same as the thermal energy capture device 220 of FIG. 2A. However, in other embodiments, the thermal energy capture device 320 of FIG. 3A may be different from the thermal energy capture device 220 of FIG. 2A.

As noted above, the non-uniform anisotropic thermal guiding coating 330 is in thermal communication with the electronic devices 310a, 310b and is in thermal communication with the thermal energy capture device 320. The non-uniform anisotropic thermal guiding coating 330 guides heat away from the electronic devices 310a, 310b. In some embodiments, the non-uniform anisotropic thermal guiding coating 330 may be deposited on a surface of the thermal energy capture device 320 in order to accomplish a thermal management objective, such as to minimize the temperature gradient of the electronic device 310a. As used herein, the "temperature gradient" of a device is the difference between the minimum temperature at any location within the device and the maximum temperature at any location within the device.

Still referring to FIG. 3A, in some embodiments, the non-uniform anisotropic thermal guiding coating 330 may be sprayed layer-wise on the electronic devices 310a, 310b and the thermal energy capture device 320, such as by the method depicted in FIG. 9, which will be described in further detail below. In some embodiments, the non-uniform anisotropic thermal guiding coating 330 may be three-dimensionally printed on the electronic devices 310a, 310b and the thermal energy capture device 320 by a three-dimensional printer. In other embodiments, the non-uniform anisotropic thermal guiding coating 330 may be formed as a separate component and later affixed and thermally coupled to the electronic devices 310a, 310b and the thermal energy capture device 320.

The non-uniform anisotropic thermal guiding coating 330 includes a plurality of layers that are non-uniformly arranged on the surface of the electronic devices 310a, 310b and on the surface of the thermal energy capture device 320 such that the thicknesses of the plurality of layers varies along the surfaces of the electronic devices 310a, 310b and the thermal energy capture device 320, as described above with reference to the variation in thicknesses of the anisotropic thermal guiding coating 120 of FIG. 1. In some embodiments, the plurality of layers of the non-uniform anisotropic thermal guiding coating 330 may be non-uniformly arranged such that the orientations and/or directions of the various layers are non-uniform relative to one another. For example, as depicted in FIG. 3A, the plurality of layers of the non-uniform anisotropic thermal guiding coating 330 are arranged in varying thicknesses and in varying orientations and directions across a width of the thermal energy guiding system 300. In some embodiments, the non-uniform anisotropic thermal guiding coating 330 of FIG. 3A may include the anisotropic thermal guiding coating 120 of FIG. 1 or any other coating described herein.

Still referring to FIG. 3A, the non-uniform anisotropic thermal guiding coating 330 may be formed from silicone including a plurality of thermally conductive particles. In the embodiment depicted in FIG. 3A, the non-uniform anisotropic thermal guiding coating 330 is formed from silicone including thermally conductive particles having a thermal conductivity of 400 W/m*K. In some embodiments, the non-uniform anisotropic thermal guiding coating 330 may include thermally conductive particles having a thermal conductivity other than 400 W/m*K. In some embodiments, the non-uniform anisotropic thermal guiding coating 330 may include a plurality of layers having differing thermal conductivities, such as in embodiments in which the non-uniform anisotropic thermal guiding coating includes layers of pure silicone and layers of silicone including thermally conductive particles.

Figure 3B:
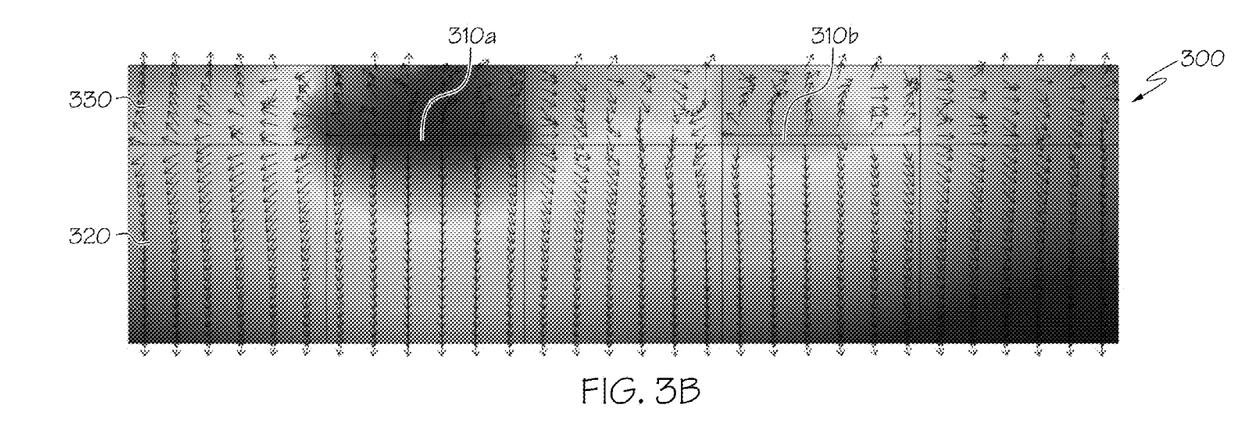
FIG. 3B schematically depicts a temperature contour plot of the thermal energy guiding system of FIG. 3A, according to one or more embodiments shown and described herein.

Referring now to FIG. 3B, a temperature contour plot of the thermal energy guiding system 300 of FIG. 3A is schematically depicted. In a manner similar to FIG. 2B, the temperature at each point within the thermal energy guiding system 300 is represented by a color, in which dark blue is the lowest temperature depicted and dark red is the highest temperature depicted. The color of the thermal energy guiding system 300 varies from dark blue to dark red at various locations within the thermal energy guiding system 300 in order to represent the temperature at each location in the manner that is known for temperature contour plots. Furthermore, FIG. 3B depicts normalized heat flux vectors at various locations within the thermal energy guiding system 300. Each of the heat flux vectors depicts the directional thermal energy transfer at the location from which the vector originates.

In the embodiment depicted in FIG. 3B, electronic device 310a generates a first amount of heat and electronic device 310b generates a second amount of heat that is two thirds the first amount of heat. The amount of heat generated by the electronic devices 310a, 310b of FIGS. 3A-3B is the same as the amount of heat generated by the electronic devices 210a, 210b of FIGS. 2A-2B. Still referring to FIG. 3B, the maximum temperature of the electronic device 310a is 420.2 K, as compared to the 425.8 K maximum temperature of the electronic device 210a of FIG. 2B. As shown by the heat flux vectors depicted in FIG. 3B, the thermal energy is dissipated from the electronic devices 310a, 310b in a directionally non-uniform manner as compared to the thermal energy dissipation pattern depicted in FIG. 2B. Specifically, a greater proportion of the thermal energy produced by the electronic device 310a is directed into the thermal energy capture device 320 in FIG. 3B than in FIG. 2B. Accordingly, it should be understood that the non-uniform anisotropic thermal guiding coating 330 of FIGS. 3A-3B may guide thermal energy from the electronic devices 310a, 310b in a non-uniform manner that decreases the maximum temperature of at least one of the electronic devices 310a, 310b as compared to a uniform thermal guiding coating.

Figure 4:
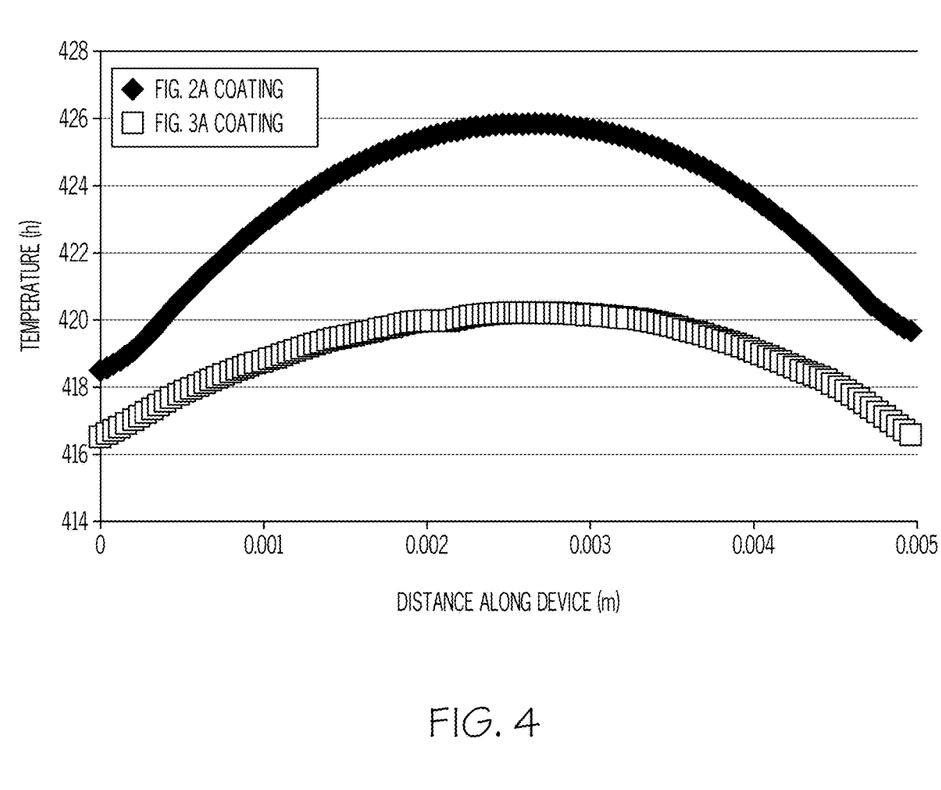
FIG. 4 schematically depicts a plot of temperature versus distance along an electronics device for the thermal energy guiding system of FIG. 2A and for the thermal energy guiding system of FIG. 3A, according to one or more embodiments shown and described herein.

Referring now to FIG. 4, a plot of temperature versus distance along an electronics device for the thermal energy guiding system 200 of FIG. 2A and for the thermal energy guiding system 300 of FIG. 3A is schematically depicted. As shown in FIG. 4, the temperature gradient of the electronic device 310a of FIG. 3A is about half of the temperature gradient of the electronic device 210a of FIG. 2A. Furthermore, the maximum, minimum, and average temperatures of the electronic device 310a of FIG. 3A is less than the corresponding maximum, minimum, and average temperatures of the electronic device 210a of FIG. 2A. Accordingly, it should be understood that the non-uniform anisotropic thermal guiding coating 330 of FIGS. 3A-3B may guide thermal energy from the electronic devices 310a, 310b in a non-uniform manner that decreases the temperature gradient of at least one of the electronic devices 310a, 310b and lowers the minimum, maximum, and average temperatures of at least one of the electronic devices 310a, 310b as compared to a uniform thermal guiding coating.

Figure 5A:
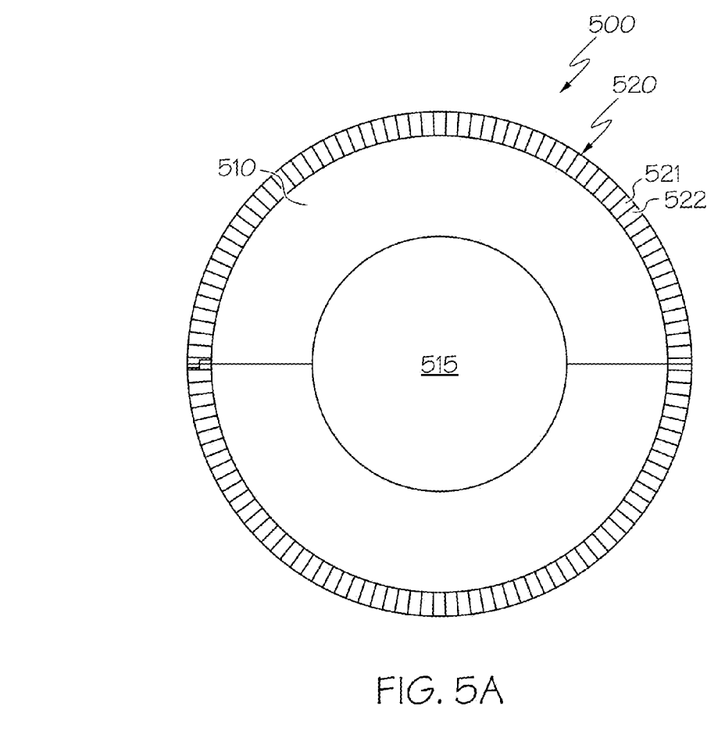
FIG. 5A schematically depicts a thermal energy guiding system including a thermal energy source coated with an anisotropic thermal guiding coating that has radially extending layers, according to one or more embodiments shown and described herein.

Referring now to FIG. 5A, a thermal energy guiding system 500 including a thermal energy source 510 coated with an anisotropic thermal guiding coating 520 having a plurality of radially extending layers is schematically depicted. In the embodiment depicted in FIG. 5A, the thermal energy source 510 is a copper ring surrounding a cavity 515. However, in other embodiments, the thermal energy source 510 may be any device that emits thermal energy. For example, in some embodiments, the thermal energy source 510 may be an electronic module or an electronic component, such as an integrated circuit. In some embodiments, the thermal energy source 510 may be a battery that emits thermal energy as a byproduct of converting chemical energy into electrical energy. In some embodiments, the thermal energy source 510 may be a motor or internal combustion engine that emits thermal energy. In some embodiments, the thermal energy source 510 may be an electronics or motor housing.

Still referring to FIG. 5A, the anisotropic thermal guiding coating 520 is in thermal communication with a surface of the thermal energy source 510. As noted above, the anisotropic thermal guiding coating 520 includes a plurality of radially extending layers. As depicted in FIG. 5A, the plurality of layers of the anisotropic thermal guiding coating 520 includes a first layer 521 and a second layer 522. The first layer 521 is in contact with the surface of the thermal energy source 510. The second layer 522 is in contact with the thermal energy source 510. The first layer 521 also contacts the second layer 522 along a layer interface that contacts the surface of the thermal energy source 510. The layer interface may be substantially non-parallel to the surface of the thermal energy source 510 at the location where the layer interface contacts the surface of the thermal energy source 510. In some embodiments, such as FIG. 5A, the layer interface may be substantially perpendicular to the surface of the thermal energy source 510 at the location where the layer interface contacts the surface of the thermal energy source. In some embodiments, the anisotropic thermal guiding coating 520 is a conformal coating that conforms to a shape of the thermal energy source 510.

Still referring to FIG. 5A, in some embodiments, the first layer 521 has a first thermal conductivity and the second layer 522 has a second thermal conductivity that is different from the first thermal conductivity. In some embodiments, the first layer 521 may be the first layer 122 as described above with reference to FIG. 1 and the second layer 522 may be the second layer 124 as described above with reference to FIG. 1. In some embodiments, the first layer 521 is formed from silicone including a plurality of thermally conductive particles and the second layer 522 is formed from silicone and does not include the thermally conducive particles.

The anisotropic thermal guiding coating 520 is coated on the surface of the thermal energy source 510 in order to accomplish a thermal management objective. In the embodiment depicted in FIG. 5A, the thermal management objective of the anisotropic thermal guiding coating 520 is to maximize uniform heat flow to the ambient environment.

Figure 5B:
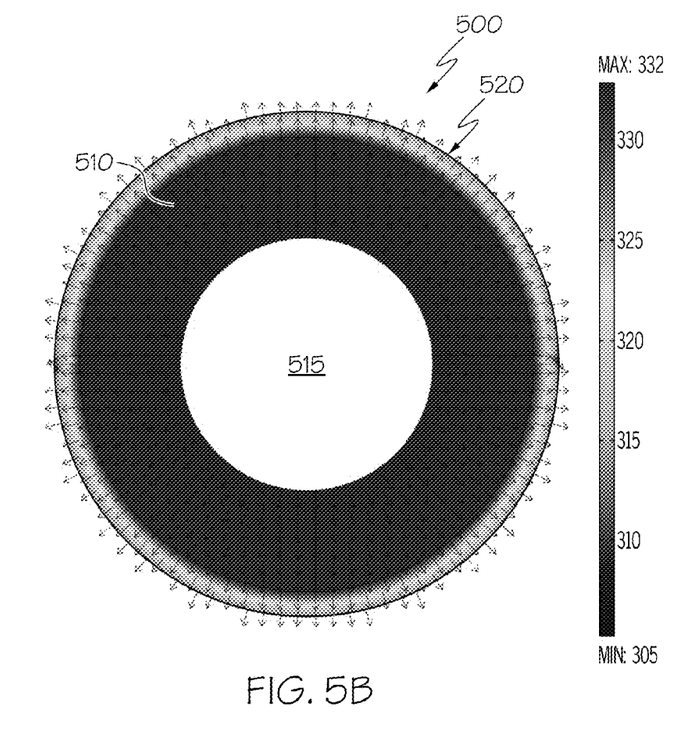
FIG. 5B schematically depicts a temperature contour plot of the thermal energy guiding system of FIG. 5A, according to one or more embodiments shown and described herein.

Referring now to FIG. 5B, a temperature contour plot of the thermal energy guiding system of FIG. 5A is schematically depicted. The maximum temperature of the thermal energy source 510 is 332 K and the minimum temperature of the thermal energy source 510 is 305 K. As shown in FIG. 5B, thermal energy flows radially outwardly in a uniform manner from the interior of the thermal energy source 510. Thus, the anisotropic thermal guiding coating 520 including a plurality of radially extending layers maximizes uniform heat flow to the ambient environment. It should be understood that thermal energy may be guided within the thermal energy source 510 by the anisotropic thermal guiding coating 520.

Figure 6A:
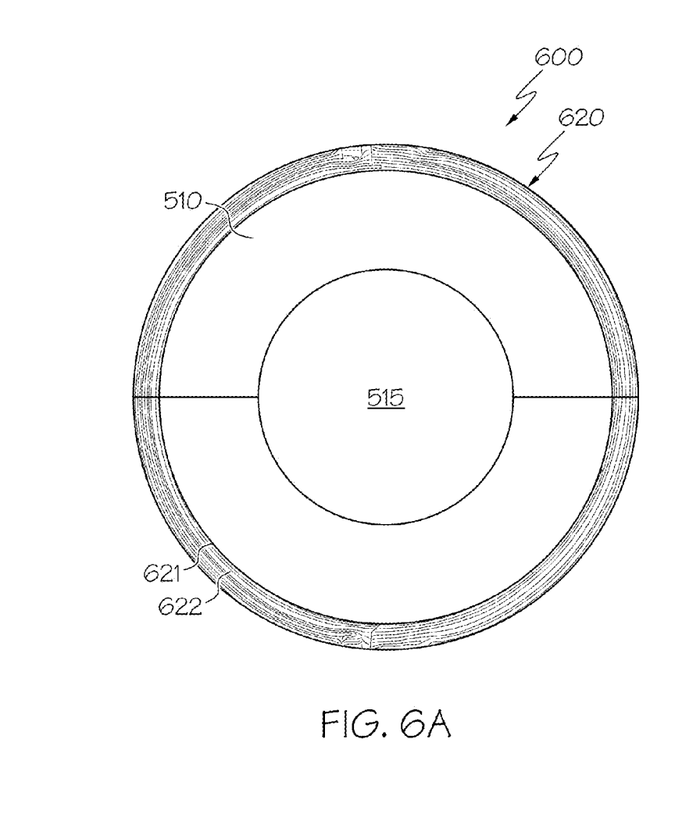
FIG. 6A schematically depicts a thermal energy guiding system including a thermal energy source coated with an anisotropic thermal guiding coating that has circumferentially extending layers, according to one or more embodiments shown and described herein.

Referring now to FIG. 6A, a thermal energy guiding system 600 including a thermal energy source 510 coated with an anisotropic thermal guiding coating 620 having a plurality of circumferentially extending layers is schematically depicted. The anisotropic thermal guiding coating 620 is in thermal communication with a surface of the thermal energy source 510. As noted above, the anisotropic thermal guiding coating 620 includes a plurality of circumferentially extending layers. As depicted in FIG. 6A, the plurality of layers of the anisotropic thermal guiding coating 620 includes a first layer 621 and a second layer 622. The first layer 621 is in contact with the surface of the thermal energy source 510. The first layer 621 is disposed between the second layer 622 and the surface of the thermal energy source 510. In some embodiments, the anisotropic thermal guiding coating 620 is a conformal coating that conforms to a shape of the thermal energy source 510.

Still referring to FIG. 6A, in some embodiments, the first layer 621 has a first thermal conductivity and the second layer 622 has a second thermal conductivity that is different from the first thermal conductivity. In some embodiments, the first layer 621 may be the first layer 122 as described above with reference to FIG. 1 and the second layer 622 may be the second layer 124 as described above with reference to FIG. 1. In some embodiments, the first layer 621 is formed from silicone including a plurality of thermally conductive particles and the second layer 622 is formed from silicone and does not include the thermally conducive particles.

The anisotropic thermal guiding coating 620 is coated on the surface of the thermal energy source 510 in order to accomplish a thermal management objective. In the embodiment depicted in FIG. 6A, the thermal management objective of the anisotropic thermal guiding coating 620 is to minimize uniform heat flow to the ambient environment.

Figure 6B:
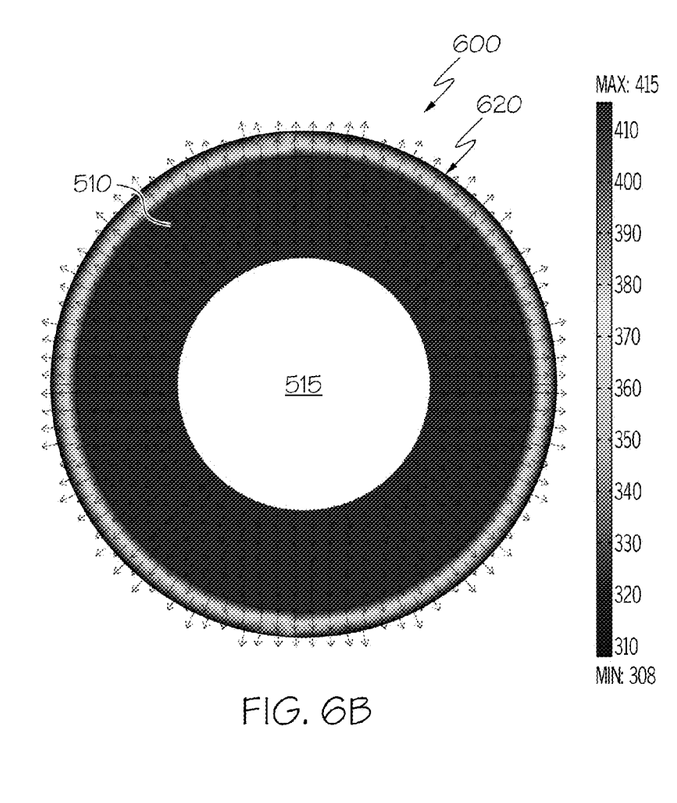
FIG. 6B schematically depicts a temperature contour plot of the thermal energy guiding system of FIG. 6A, according to one or more embodiments shown and described herein.

Referring now to FIG. 6B, a temperature contour plot of the thermal energy guiding system of FIG. 6A is schematically depicted. The maximum temperature of the thermal energy source 510 is 415 K and the minimum temperature of the thermal energy source 510 is 308 K. As shown in FIG. 6B, thermal energy flows radially outwardly in a uniform manner from the interior of the thermal energy source 510. However, the maximum temperature of the thermal energy source 510 of FIG. 6B is 83 K higher than the maximum temperature of the thermal energy source 510 of FIG. 5B, indicating that the anisotropic thermal guiding coating 620 of FIGS. 6A-6B, which includes a plurality of circumferentially extending layers minimizes uniform heat flow to the ambient environment. It should be understood that thermal energy may be guided within the thermal energy source 510 by the anisotropic thermal guiding coating 620.

Figure 7A:
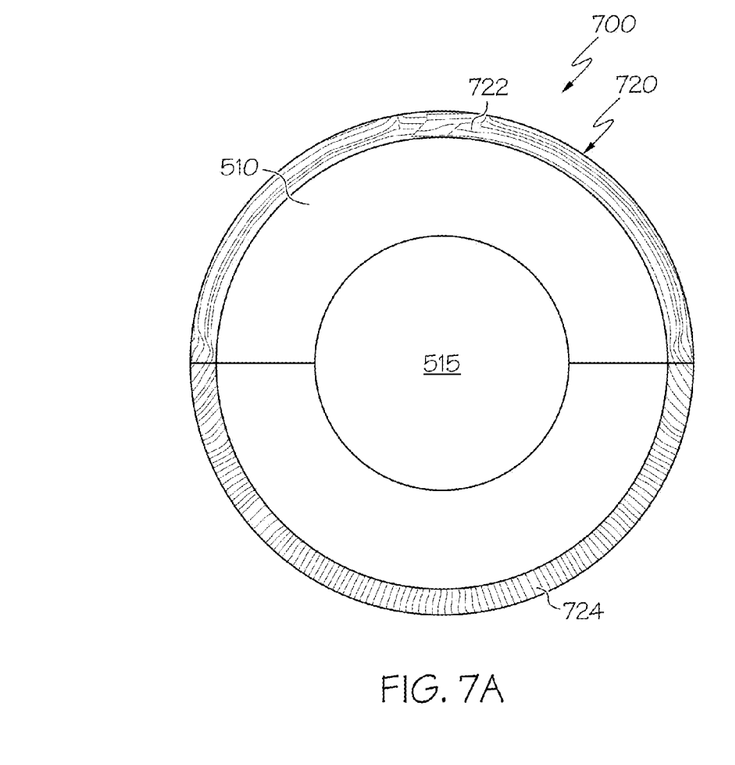
FIG. 7A schematically depicts a thermal energy guiding system including a thermal energy source coated with an anisotropic thermal guiding coating that has both radially extending layers and circumferentially extending layers, according to one or more embodiments shown and described herein.

Referring now to FIG. 7A, a thermal energy guiding system 700 including a thermal energy source 510 coated with an anisotropic thermal guiding coating 720 having both a plurality of radially extending layers 724 and a plurality of circumferentially extending layers 722 is schematically depicted. The anisotropic thermal guiding coating 720 is in thermal communication with a surface of the thermal energy source 510. As noted above, the anisotropic thermal guiding coating 720 includes a plurality of radially extending layers 724 and a plurality of circumferentially extending layers 722. The plurality of radially extending layers 724 may be configured as described above with respect to the radially extending layers of the anisotropic thermal guiding coating 520 of FIGS. 5A-5B. Likewise, the plurality of circumferentially extending layers 722 may be configured as described above with respect to the circumferentially extending layers of the anisotropic thermal guiding coating 620 of FIGS. 6A-6B.

The anisotropic thermal guiding coating 720 is coated on the surface of the thermal energy source 510 in order to accomplish a thermal management objective. In the embodiment depicted in FIG. 7A, the thermal management objective of the anisotropic thermal guiding coating 720 is to optimize non-uniform heat flow to a specific location by appropriately arranging the layers of the anisotropic thermal guiding coating 720. Specifically, the thermal management objective of the anisotropic thermal guiding coating 720 is to minimize uniform heat flow to the ambient environment from the top half of the thermal energy source 510 with the plurality of circumferentially extending layers 722 and to maximize uniform heat flow to the ambient environment from the bottom half of the thermal energy source 510 with the plurality of radially extending layers 724.

Figure 7B:
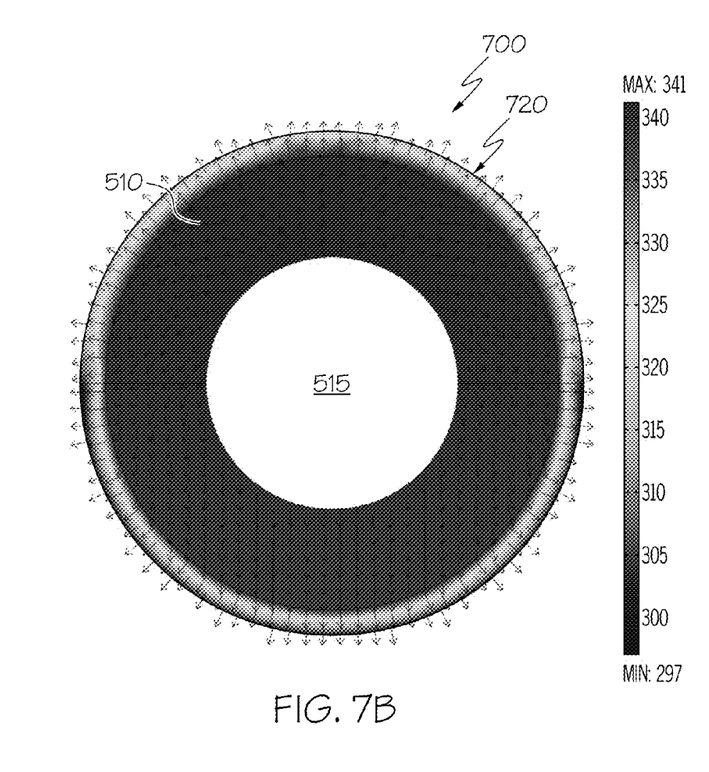
FIG. 7B schematically depicts a temperature contour plot of the thermal energy guiding system of FIG. 7A, according to one or more embodiments shown and described herein.

Referring now to FIG. 7B, a temperature contour plot of the thermal energy guiding system of FIG. 7A is schematically depicted. The maximum temperature of the thermal energy source 510 is 341 K and the minimum temperature of the thermal energy source 510 is 297 K. The maximum temperature of the thermal energy source 510 of FIG. 7B is 9 K higher than the maximum temperature of the thermal energy source 510 of FIG. 5B. As shown in FIG. 7B, uniform heat flow to the ambient environment from the top half of the thermal energy source 510 is reduced with the plurality of circumferentially extending layers 722 and uniform heat flow to the ambient environment from the bottom half of the thermal energy source 510 is increased with the plurality of radially extending layers 724. It should be understood that thermal energy may be guided within the thermal energy source 510 by the anisotropic thermal guiding coating 720.

Figure 8A:
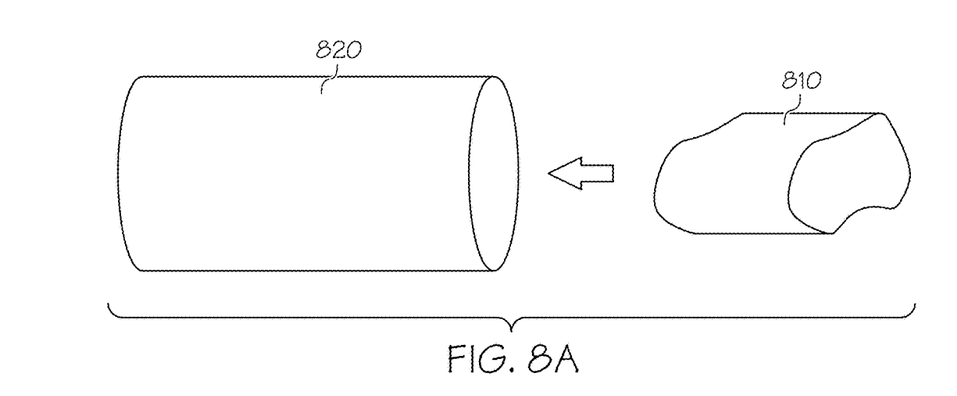
FIG. 8A schematically depicts a method for fabricating a thermal guiding system, according to one or more embodiments shown and described herein.
Figure 8B:
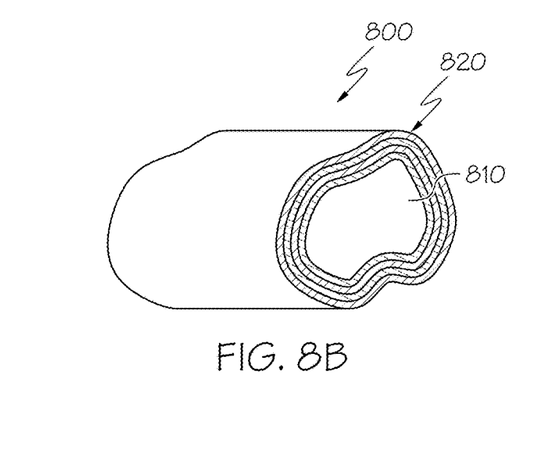
FIG. 8B schematically depicts a thermal energy guiding system fabricated by the method depicted in FIG. 8A, according to one or more embodiments shown and described herein.
Figure 9:
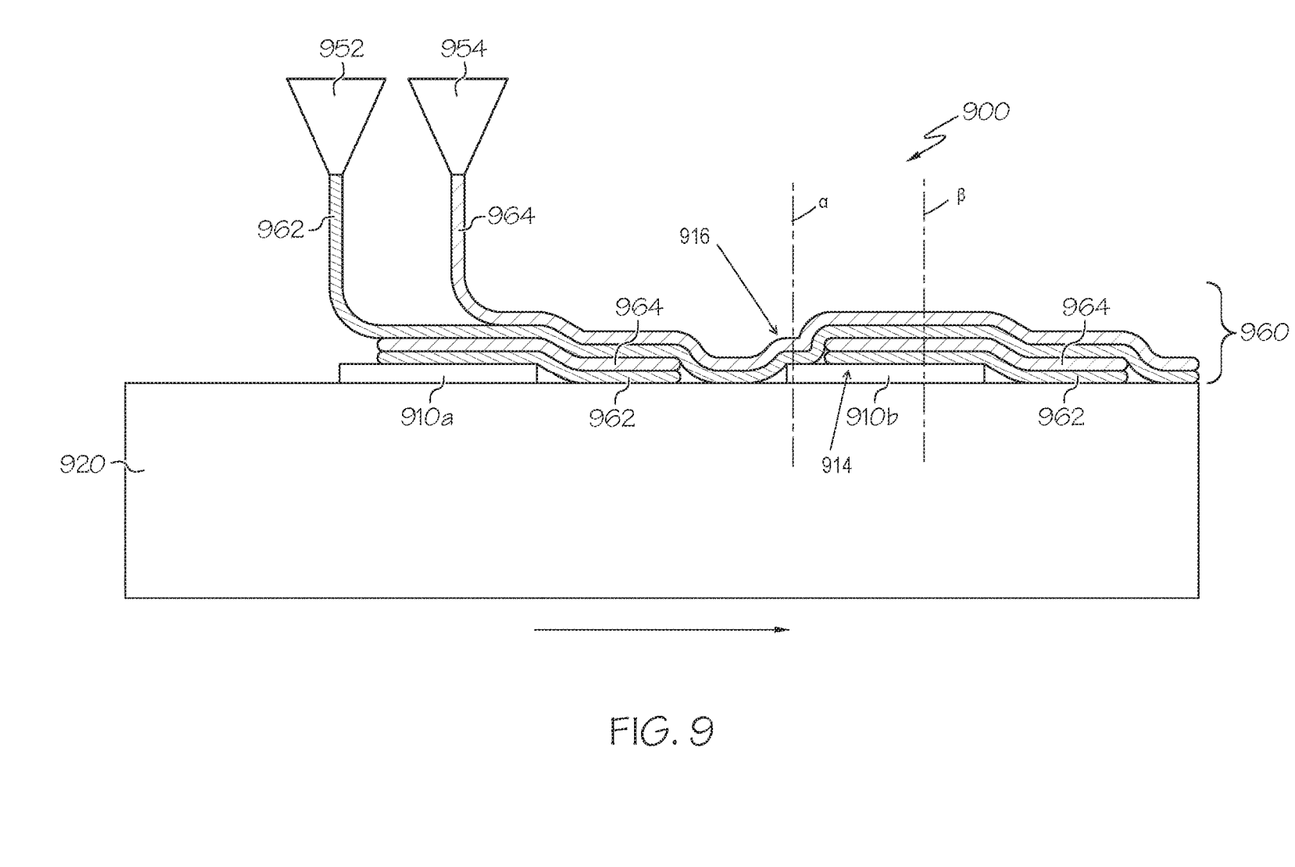
FIG. 9 schematically depicts a method for fabricating a thermal energy guiding system, according to one or more embodiments shown and described herein.

Referring now to FIGS. 8A-9, methods for fabricating thermal energy guiding systems are schematically depicted. The methods include providing a thermal energy source and coating a surface of the thermal energy source with an anisotropic thermal guiding coating in a non-uniform manner such that the anisotropic thermal energy guiding coating is in thermal communication with the surface of the thermal energy source. The anisotropic thermal guiding coating includes a plurality of layers including a first layer and a second layer. The first layer has a first thermal conductivity and the second layer has a second thermal conductivity. The plurality of layers are non-uniformly arranged on the surface of the thermal energy source in order to guide thermal energy from the thermal energy source according to a thermal energy management objective. Each of the specific methods depicted in FIGS. 8A-9 will now be described in turn.

Now referring specifically to FIG. 8A, a method for fabricating a thermal energy guiding system is schematically depicted. First, a thermal energy source 810 is provided. In some embodiments, the thermal energy source 810 may be an electromechanical device, an electronics module, a battery, a motor, an internal combustion engine, or any thermal energy source described herein. Next, a surface of the thermal energy source 810 is coated with an anisotropic thermal guiding coating in a non-uniform manner, such that the anisotropic thermal energy guiding coating is in thermal communication with the surface of the thermal energy source. In the embodiment depicted in FIG. 8A, the surface of the thermal energy source 810 is coated by: providing a heat shrink tube 820 (e.g., a Mylar tube, or the like) including the anisotropic thermal guiding coating, positioning the thermal energy source 810 within the heat shrink tube 820, and applying heat to the heat shrink tube 820. When heat is applied to the heat shrink tube 820, the heat shrink tube 820 conforms to the shape of the thermal energy source 810 such that the anisotropic thermal guiding coating is in thermal communication with the surface of the thermal energy source 810, as depicted in the fabricated thermal guiding system of FIG. 8B. The anisotropic thermal guiding coating of the heat shrink tube 820 may have the composition of any of the thermal guiding coatings described herein.

Now referring specifically to FIG. 9, a method for fabricating a thermal energy guiding system 900 is schematically depicted. First, a thermal energy source 910a, 910b is provided. In some embodiments, the thermal energy source 910a, 910b may be electronics modules, such as a microprocessors, integrated circuits, or other electronics components. Next, a surface of the thermal energy source 910a, 910b is coated with an anisotropic thermal guiding coating 960 in a non-uniform manner, such that the anisotropic thermal guiding coating 960 is in thermal communication with the surface of the thermal energy source 910a, 910b. In the embodiment depicted in FIG. 9, the surface of a thermal energy capture device 920 (e.g., a heat sink, an aluminum heat spreader, or the like) is also coated with the anisotropic thermal guiding coating 960. In the embodiment depicted in FIG. 9, the surface of the thermal energy source 910a, 910b and the surface of the thermal energy capture device 920 are coated by spraying a first layer 962 from a first dispensing nozzle 952 and spraying a second layer 964 from a second dispensing nozzle 954. Multiple layers of the material dispensed by the first dispensing nozzle 952 and/or multiple layers of the material dispensed by the second dispensing nozzle 954 may be applied to coat the thermal energy source 910a, 910b and/or the thermal energy capture device 920 so as to include, for example, a third layer and a fourth layer as illustrated in FIG. 9. FIG. 9 illustrates a first cross section α and a second cross section β of the anisotropic thermal guiding coating 960 both taken perpendicular to a surface of the thermal energy source 910b at a first location and a second location respectively. As illustrated, a fewer number of layers may be present at the first cross-section than at the second cross section. In some embodiments, the thermal energy source 910a, 910b and thermal energy capture device 920 may be moved back and forth (e.g., by a conveyor belt) as material is dispensed from the dispensing nozzles in order to fabricate the anisotropic thermal guiding coating 960 as desired. In some embodiments, the dispensing nozzles may be moved as material is dispensed in order to fabricate the anisotropic thermal guiding coating 960 as desired. While the embodiment depicted in FIG. 9 includes two dispensing nozzles, other embodiments may include more than two dispensing nozzles, each of which may dispense the same or different material from the first dispensing nozzle 952 and the second dispensing nozzle 954. The anisotropic thermal guiding coating 960 may have the composition of any of the thermal guiding coatings described herein.

While specific methods of fabricating the coatings described herein have been provided with reference to FIGS. 8A-9, it should be understood that the coatings described herein may be fabricated by a variety of other methods, such as three-dimensional printing, or the like.

It should now be understood that the anisotropic thermal guiding coatings described herein may allow thermal energy that is emitted by thermal energy sources to be guided within thermal energy systems according to a variety of thermal energy management objectives. Furthermore, it should be understood that such guided thermal energy may be captured or harvested for further use. Finally, applying the anisotropic thermal guiding coatings described herein to thermal energy sources allows for thermal energy to be guided while avoiding the complexity that may arise when attempting to guide thermal energy within the thermal energy source by forming the thermal energy source from a bulk composite that includes specifically designed microstructures within the composition of the thermal energy source itself.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:
1. A thermal energy guiding system comprising:
a thermal energy source;
a thermal energy capture device; and
an anisotropic thermal guiding coating in thermal communication with a surface of the thermal energy source and in thermal communication with the thermal energy capture device, wherein:
the thermal energy source is disposed between the thermal energy capture device and the anisotropic thermal guiding coating; and
the anisotropic thermal guiding coating includes a plurality of layers including a first layer and a second layer such that the first layer contacts the surface of the thermal energy source, and the second layer contacts the first layer, wherein the first layer has a first thermal conductivity and the second layer has a second thermal conductivity, wherein the plurality of layers are non-uniformly arranged on the surface of the thermal energy source in order to guide thermal energy from the thermal energy source according to a thermal energy management objective, wherein:
the first layer is formed from a first insulating material including a first plurality of thermally conductive particles, wherein the first layer has a first concentration of thermally conductive particles; and
the second layer is formed from a second insulating material including a second plurality of thermally conductive particles, wherein the second layer has a second concentration of thermally conductive particles, wherein the first concentration exceeds the second concentration, wherein thicknesses of each of the plu- rality of layers non-uniformly vary relative to one another along the surface of the thermal energy source such that:
a first thickness of the first layer taken at a first cross section of the anisotropic thermal guiding coating taken perpendicular to the surface of the thermal energy source at a first location of the surface is different than a second thickness of the first layer taken at a second cross section of the anisotropic thermal guiding coating taken perpendicular to the surface of the thermal energy source at a second location of the surface;
a first thickness of the second layer taken at the first cross section of the anisotropic thermal guiding coating is different than a second thickness of the second layer taken at a second cross section of the anisotropic thermal guiding coating; and
at least the first thickness of the first layer is different from the first thickness of the second layer.

2. The thermal energy guiding system of claim 1, wherein the first plurality of thermally conductive particles includes a metal particle, a graphite particle, a fiber composite particle, a ceramic particle, or combinations thereof.

3. The thermal energy guiding system of claim 1, wherein the anisotropic thermal guiding coating is a conformal coating that conforms to a shape of the thermal energy source.

4. The thermal energy guiding system of claim 1, wherein the thermal energy source is an electronics module or a motor.

5. The thermal energy guiding system of claim 1, wherein the thermal energy management objective includes guiding heat from the thermal energy source to the thermal energy capture device.

6. The thermal energy guiding system of claim 1, wherein the surface of the thermal energy source is substantially linear.

7. A thermal energy guiding system comprising:
a thermal energy source;
an anisotropic thermal guiding coating in thermal communication with a first surface of the thermal energy source, wherein:
the anisotropic thermal guiding coating is a conformal coating that conforms to a shape of the thermal energy source;
the anisotropic thermal guiding coating includes a first plurality of layers and a second plurality of layers;
the first plurality of layers includes a first layer and a second layer;
each of the first layer and the second layer have a first thermal conductivity;
the second plurality of layers includes a third layer and a fourth layer;
each of the third layer and the fourth layer have a second thermal conductivity;
the first layer of the first plurality of layers contacts the surface of the thermal energy source;
the third layer of the second plurality of layers is disposed between and in contact with the first layer of the first plurality of layers and the second layer of the first plurality of layers;
the second layer of the first plurality of layers is disposed between and in contact with the third layer of the second plurality of layers and the fourth layer of the second plurality of layers;
the first layer and the second layer are formed from a first insulating material;
the third layer and the fourth layer are formed from a second insulating material;
a first cross section of the anisotropic thermal guiding coating taken perpendicular to the surface of the thermal energy source at a first location of the surface includes the second layer and does not include the first layer; and
a second cross section of the anisotropic thermal guiding coating taken perpendicular to the surface of the thermal energy source at a second location of the surface includes the first layer, the second layer, the third layer, and the fourth layer; and
a thermal energy capture device comprising a coupling surface and coupled to a second surface of the thermal energy source opposite the anisotropic thermal guiding coating, wherein the first layer is in contact with the first surface of the thermal energy source and the coupling surface of the thermal energy capture device, and the second layer is in contact with the surface of the thermal energy source.

8. The thermal energy guiding system of claim 7 wherein the first insulating material is silicone and the second insulating material is silicone.

9. The thermal energy guiding system of claim 7, wherein the first layer is in contact with the surface of the thermal energy source, the second layer is in contact with the thermal energy source, and the first layer is in contact with the second layer.

10. A thermal energy guiding system comprising:
a thermal energy source; and
an anisotropic thermal guiding coating in thermal communication with a first surface of the thermal energy source, wherein:
the anisotropic thermal guiding coating includes a first layer, a second layer, and a third layer;
the first layer and the second layer have a first thermal conductivity;
the third layer has a second thermal conductivity;
a first cross section of the anisotropic thermal guiding coating taken perpendicular to the surface of the thermal energy source at a first location of the surface includes the second layer and does not include the first layer; and
a second cross section of the anisotropic thermal guiding coating taken perpendicular to the surface of the thermal energy source at a second location of the surface includes the first layer, the second layer, and the third layer, wherein the third layer is disposed between the first layer and the second layer; and
a thermal energy capture device comprising a coupling surface and coupled to a second surface of the thermal energy source opposite the anisotropic thermal guiding coating, wherein the first layer is in contact with the first surface of the thermal energy source and the coupling surface of the thermal energy capture device, and the second layer is in contact with the first surface of the thermal energy source.

11. The thermal energy guiding system of claim 10, wherein the anisotropic thermal guiding coating further includes a fourth layer, wherein the fourth layer has the second thermal conductivity, wherein at least one of the first cross section and the second cross section includes the fourth layer.

12. The thermal energy guiding system of claim 11, wherein:
the first layer and the second layer are formed from a first insulating material including a first plurality of thermally conductive particles, wherein the first layer and the second layer have a first concentration of thermally conductive particles; and the third layer and the fourth layer are formed from a second insulating material including a second plurality of thermally conductive particles, wherein the third layer and the fourth layer have a second concentration of thermally conductive particles, wherein the first concentration exceeds the second concentration.

13. The thermal energy guiding system of claim 11, wherein:

the third layer is disposed between the first layer and the second layer; and the second layer is disposed between the third layer and the fourth layer.

14. The thermal energy guiding system of claim 10, wherein the anisotropic thermal guiding coating is a conformal coating that conforms to a shape of the thermal energy source.

15. The thermal energy guiding system of claim 10, wherein one of the first layer and the second layer contacts the thermal energy source at the first location and the other of the first layer and the second layer contacts the thermal energy source at the second location.

16. The thermal energy guiding system of claim 10, further comprising a second thermal energy source coupled to the coupling surface of the thermal energy capture device, wherein the first layer is discontinuous between the thermal energy source and the second thermal energy source.

* * * * *